United States Patent [19]

Matsuda

[11] 4,130,761
[45] Dec. 19, 1978

[54] ELECTRON BEAM EXPOSURE APPARATUS
[75] Inventor: Takashi Matsuda, Kasugai, Japan
[73] Assignee: Tokyo Shibaura Electric Co., Ltd., Tokyo, Japan
[21] Appl. No.: 782,755
[22] Filed: Mar. 30, 1977

[30] Foreign Application Priority Data

Mar. 31, 1976 [JP] Japan .................................. 51-35657

[51] Int. Cl.² .............................................. H01J 37/26
[52] U.S. Cl. .................................. 250/492 A; 250/398
[58] Field of Search ............... 250/398, 492 A, 492 R, 250/396 R; 313/421, 426, 361, 360; 219/121 EB, 121 EM

[56] References Cited

U.S. PATENT DOCUMENTS

| | | | |
|---|---|---|---|
| 3,491,236 | 1/1970 | Newberry | 250/492 A |
| 3,619,608 | 11/1971 | Westerberg | 250/492 A |
| 3,715,580 | 2/1973 | Mackawa et al. | 250/492 A |
| 3,717,785 | 2/1973 | Guernet | 250/492 A |
| 3,736,425 | 5/1973 | Chernow | 250/492 A |
| 3,900,737 | 8/1975 | Collier et al. | 250/492 A |
| 3,956,635 | 5/1976 | Chang | 250/492 A |

Primary Examiner—Bruce C. Anderson
Attorney, Agent, or Firm—Finnegan, Henderson, Farabow & Garrett

[57] ABSTRACT

An electron beam exposure apparatus is provided with a blanking section to which electron beams emitted from an electron gun whose directions are paralleled through condenser lens are projected. The blanking section includes a slit plate with a plurality of perforations equally spaced for dividing the parallel electron beams into a plurality of electron beam bundles, plural sets of deflection electrodes disposed along the path of the advancing bundles of electron beams passing through the perforations of the slit plate in such a way that each bundle of electron beams passes between each set of deflection electrodes, and a mask plate with a plurality of perforations permitting straight advancing of only the bundles of electron beams passed through the perforations of the slit plate. The blanking section selectively blocks or permits the advancing therethrough of the bundles of electron beams. The bundles of electron beams passed through the blanking section are reduced, or compressed by a projection lens and their directions are pralleled thereby. All of the bundles of parallel electron beams passed through the projection lens are deflected by a deflection apparatus and then projected onto a predetermined region of the photoresist of the wafer. As a result, on the predetermined area on the photoresist of the wafer, the bundles of electron beams are scanned slightly, so that a given pattern is exposed.

16 Claims, 9 Drawing Figures

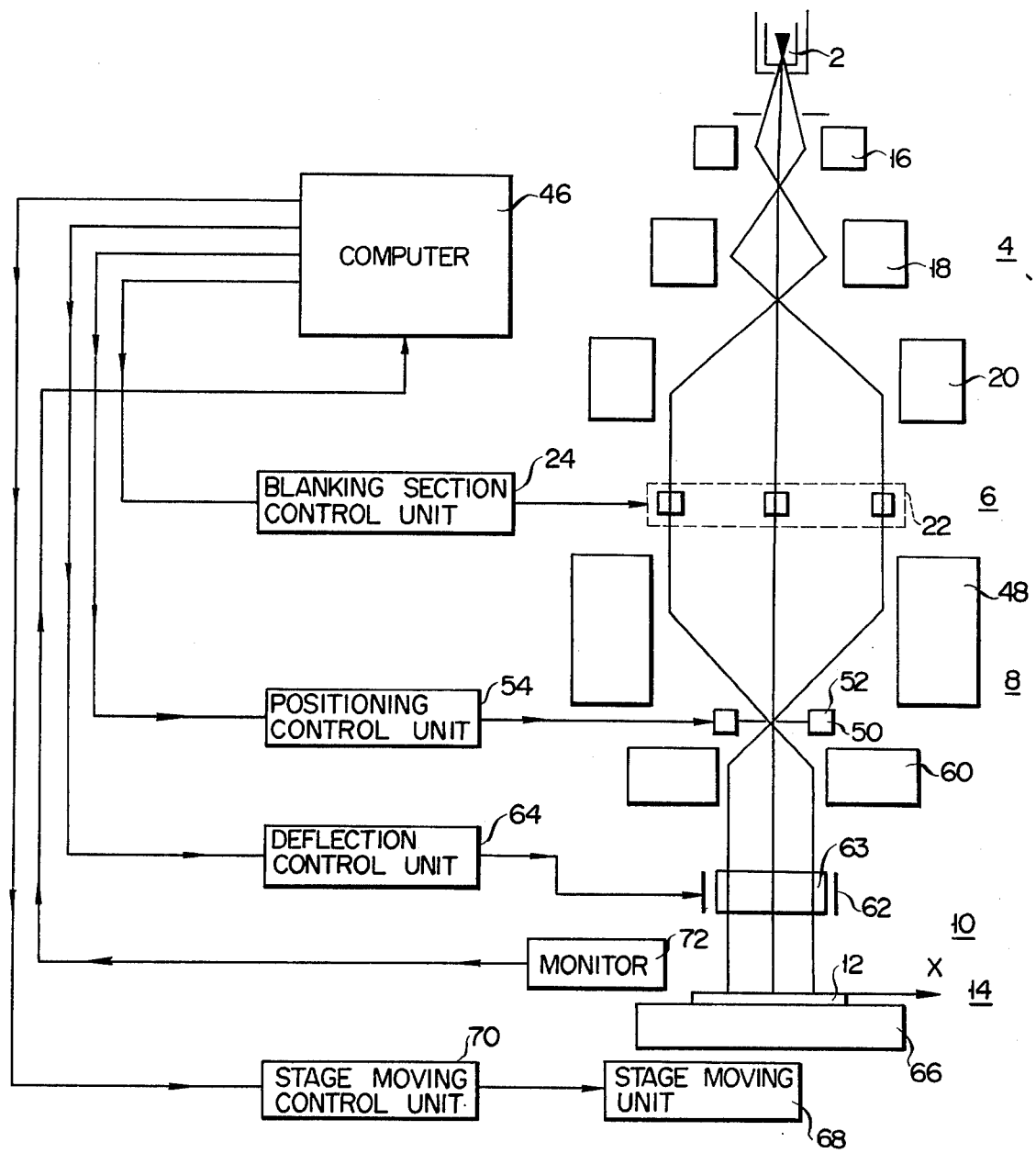
F I G. 1

ELECTRON BEAM EXPOSURE APPARATUS

BACKGROUND OF THE INVENTION

The present invention relates to an electron beam exposure apparatus.

The electron beam exposure apparatus is used to expose a given pattern on the photoresist of the wafer in the manufacturing process of semiconductor integrated circuit device. The electron beam exposure apparatus is superior to the ultraviolet exposure apparatus when it is intended to integrate in high density semiconductor devices. In the ultraviolet exposure apparatus, the diffraction of ultraviolet restricts the resolution limit so that the minimum width of the exposure pattern is at most $2\mu$. Further narrower width thereof is almost impossible. To the contrary, in the case of the electron beam exposure apparatus, the minimum width of the exposure pattern is about $0.1\mu$ for the reason that the wave length of the electron beam is very short as compared to that of the ultraviolet and thus the affect of diffraction is small, thereby enabling a very small resolution limit.

Generally, the electron beam exposure apparatus is classified into electron beam scanning type exposure apparatus and electron beam projection type exposure apparatus. The electron beam scanning type exposure apparatus is such that a single electron beam is used to scan the photoresist on the wafer and projection and non-projection are repeated every scanning unit in accordance with the exposure pattern. The electron beam projection type exposure apparatus uses a foil mask of the so called self-supporting type consisting of a plurality of masks permitting electron beams configured in a predetermined pattern to pass therethrough. The parallel electron beams are irradiated onto the foil mask to form an image on the photoresist of the wafer. Both the exposure apparatuses of the electron beam scanning type and the electron beam projection type are suitable for the high density integration of semiconductor devices, as compared to the ultraviolet exposure apparatus. However, these apparatuses suffer from some disadvantages and present problems in practical use.

As mentioned above, a single electron beam scans the wafer in the electron beam scanning apparatus. For this, various types of patterns may be easily and precisely exposed. But this type exposure apparatus takes a relatively long time for one time pattern exposure. In the manufacturing process of semiconductor devices, several time exposures of the pattern are necessary. Therefore, the electron beam scanning exposure apparatus is improper in application for the mass production of the semiconductor integrated circuit devices.

On the other hand, the electron beam projection type exposure apparatus takes a very short time, for example, several seconds, for one time exposure of the pattern and has a very deep focal depth. With the deep focal depth, the pattern may be exposed precisely even if the wafer is deformed or the moving stage vertically moves a slight degree. However, it is very difficult to make precisely the foil mask. More adversely, such a precise foil mask must be made separately for individual circuit constructions of semiconductor devices. Thus, the electron beam projection type exposure apparatus is defective in this regard.

SUMMARY OF THE INVENTION

Accordingly, the primary object of the present invention is to provide an electron beam exposure apparatus in which a pattern may be exposed rapidly and precisely.

Another object of the present invention is to provide an electron beam exposure apparatus in which the pattern exposure may be made easily and inexpensively, and versatilely for different circuit constructions of semiconductor devices.

The present invention may be briefly summarized as involving an electron beam exposure apparatus comprising: an electron gun; condenser means for paralleling the electron beams emitted from the electron gun; blanking means in which the parallel electron beams passed through the condenser means are divided into a plurality of electron beam bundles and the plurality of electron beam bundles are selectively intercepted; deflection means for deflecting in a predetermined direction all the bundles of parallel electron beams passed through the blanking means; and stage means on which a wafer to be scanned by the bundles of electron beams deflected by the deflection means is placed and by which the wafer is moved by a predetermined distance.

Other objects and features of the present invention will be apparent upon a careful consideration of the following description when taken in conjunction with the accompanying drawings, in which:

BRIEF DESCRIPTION OF THE DRAWING

FIG. 1 schematically illustrates an embodiment of an electron beam exposure apparatus according to the present invention;

DESCRIPTION OF THE PREFERRED EMBODIMENTS

Figure 2:
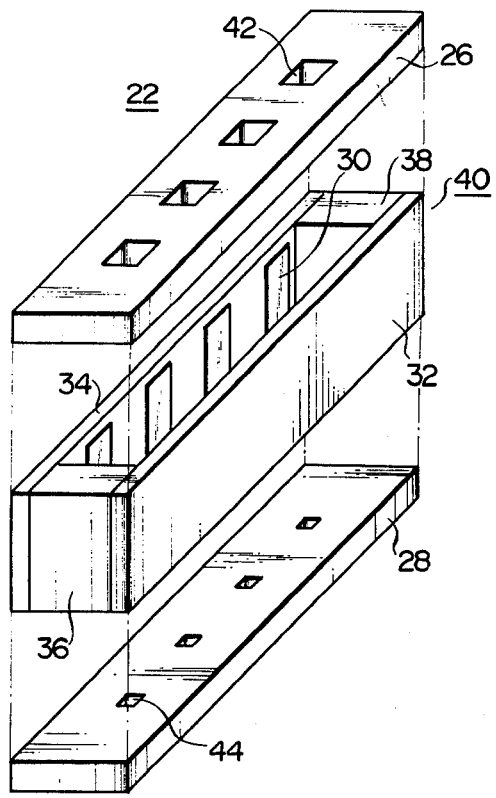
FIG. 2 is a perspective view of a blanking section of the electron beam exposure apparatus according to the present invention.

Reference will be made to FIG. 1 illustrating a schematic diagram of an electron beam exposure apparatus according to the present invention. In the figure, the electron beam exposure apparatus comprises an electron gun 2, a condenser generally indicated at 4 for paralleling the electron beams emitted from the electron gun 2, a blanking apparatus generally indicated at 6 in which the paralleled electron beams are divided into a plurality of bundles of electron beams paralleled in advancing direction and the passing and interception of the bundles of the parallel electron beams are controlled, and a lens means 8 condensing the bundles of parallel electron beams for irradiation. The electron beam exposure apparatus further includes a deflection means generally designated by reference numeral 10 and a stage means generally designated by 14 on which a wafer 12 to be irradiated by electron beams is placed and movable with the stage means 14.

The electron gun 2 connected with a high voltage generating means (not shown) generates electron beams, for example, of 20KV for the acceleration voltage and 800 μA for the beam current.

The condenser 4 includes first, second and third condenser lens 16, 18 and 20, in which the electron beams emitted from the electron gun 2 are diverged and condensed to form parallel electron beams in turn directed to a blanking plate 22. The coils of the respective condenser lenses 16 to 20 are supplied with coil currents. The electron beams passing through the condenser lenses are controlled, more particularly by the magnetic field developed by the coil current.

The blanking apparatus 6 includes a blanking section 22 and a blanking section control means 24. The detail of the blanking section 22 is shown in FIG. 2. As shown, the blanking section 22 includes a slit plate 26, a mask plate 28 disposed facing the slit plate 26, a plurality of pairs of electrodes 30 each pair having electrodes facing each other, a pair of substrates, such as sapphire substrate plates 32 and 34, disposed facing each other onto which the electrodes 30 are mounted, and a pair of spacers 36 and 38 for spacing by a predetermined distance sapphire plates 32 and 34. As shown, sapphire plates 32 and 34 and the spacers 36 and 38 are assembled into a frame 40 with a pair of openings. Both the openings are fixedly closed by the slit plate 26 and the mask plate 28, respectively. These plates are made, for example, of gold foil. A plurality of rectangular or circular perforations 42 and 44 are correspondingly formed on the respective plates 26 and 28. The perforations of one plate are aligned on a rectilinear line with corresponding peforations of the other plate. Moreover, these perforations formed in each plate are equally spaced in distance. The perforations 42 of the plate 26 are substantially equal in size and configuration to each other and the same thing is true with the perforations 44 of the plate 28. However, it is not necessary that both the perforations 42 and 44 for the plates 26 and 28 be substantially equal in size and configuration. The perforations 42 and 44 of the respective plates are disposed such that the center of each perforation of one plate horizontally coincides with the corresponding one of the other plate.

Figure 3:
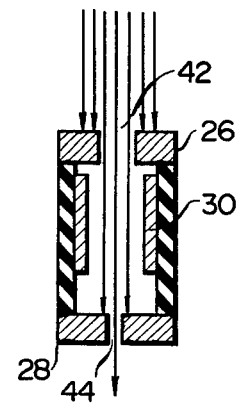
FIG. 3 and 4 schematically illustrate the operation of the blanking section shown in FIG. 2.
Figure 4:
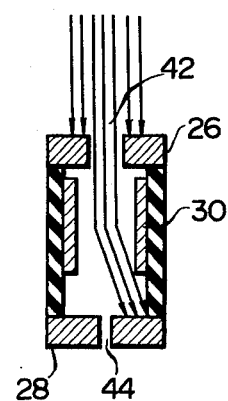

The slit plate 26 divides the parallel electron beams aligned in direction by the condenser lens 20 into the plurality bundles of electron beams through the perforations 42 of the slit plate 26. More precisely, some electron beams pass through the perforations and some electron beams bombard the surface of the slit plate 26, thereby being blocked or intercepted for further transmission. In this manner, the electron beams are divided into a plurality of electron beam bundles. The electrodes 30 are disposed so that each bundle of electron beams passes between a pair of opposed electrodes 30. The respective pairs of the electrodes 30 are connected to the blanking section control unit 24 and are properly controlled according to the commands from a computer 46. As shown in FIG. 3, when the blanking section control unit 24 does not apply a voltage to a particular pair of electrodes 30, the bundles of electron beam passed through the respective perforation 42 of the plate 26 travel through these electrodes 30 and the respective perforation 44, straightforwardly. Conversely, when a voltage from the blanking section control unit 24 is applied to a particular pair of electrodes 30, the electric field developed between the electrodes bends the direction of the advancing bundles of electron beams so that the bundles of electron beams deviate from the respective perforation 44 to hit the plate 28 surface, as shown in FIG. 4. In response to the commands fed from the computer 46, the blanking section control unit 24 controls the respective pairs of electrodes as mentioned above so that only selected bundles of electron beams are permitted to continue to be transmitted. In other words, the mask plate 28 serves as a mask and, through the control of the blanking section control unit 24, a predetermined number of electron beams bundles are permitted to pass through the mask plate 28.

The lens means 8 includes a first projection lens 48 for focussing the bundles of electron beams passing through the perforations 44 of the mask plate 28, a positioning coil 50 disposed close to the focal point of the first projection lens 48, a collimeter 52 positioned at the same place, a positioning control unit 54 for controlling the positioning coil 50, and a second projection lens 60 for paralleling the bundles of electron beams focussed by the first projection lens 48 for irradiating the wafer 12. The bundles of electron beams from the mask plate 28 are compressed to 1/10 the diameter of the electron beam bundles and irradiate the wafer 12. The positioning coil 50 is controlled by the coil current fed from the positioning control unit 54 in order to slightly shift the position of the focal point of the electron beam bundles passed through the first projection lens 48 on the focal point surface of the first projection lens 48 to change the irradiation region of the beam bundles. The positioning control unit 54 controls the positioning coil 50 in response to the command from the computer 46.

The deflection means 10 comprises a pair of X-deflection electrodes 62 and a deflection control unit 64 for controlling the X-deflection electrodes 62. The deflection control unit 64, upon receipt of a command from the computer 46, applies a voltage to the deflection electrodes 62 to develope an X-directional electric field between the deflection electrodes 62. The X-directional electric field deflects all the bundles of electron beams in parallel travelling through the second projection lens 66 in the direction of X as indicated by the arrow, in FIG. 1 with the result that the total of the parallel electron beam bundles swings in a given direction for a given period of time. The deflection means 10 may be further provided with a pair of Y deflection electrodes indicated at 63, in addition to the X-deflection electrodes 62. The Y-deflection electrodes 63 keep in the Y-direction by a predetermined value deflection of the parallel electron beam bundles for the time that the X-deflection electrodes 62 deflect in the X-direction the electron beam bundles. If after the X-deflection electrodes 62 are operated one time, the Y-deflection electrodes 63 are operated and then the X-deflection electrodes 62 are again operated, the irradiation region of the parallel electron beam bundles is enlarged.

The stage means 14 is comprised of a stage 66 on which the wafer 12 is placed, a stage moving unit 68 for moving the stage 66, a stage moving control unit 70 for controlling the stage movement and a monitor means 72 for measuring the movement of the wafer 12 moved by means of the stage moving unit 68, e.g. a laser interferometer. The stage moving control unit 70 is operated in response to the command of the computer 46. After the electron beam bundles are deflected in the X-direction by the X-deflection electrodes 62, the table 12 is moved in the Y-direction substantially normal to the X-direction and when the exposure on the given region of the wafer 12 is completed, the table 12 is again moved in the X-direction.

Figure 5:
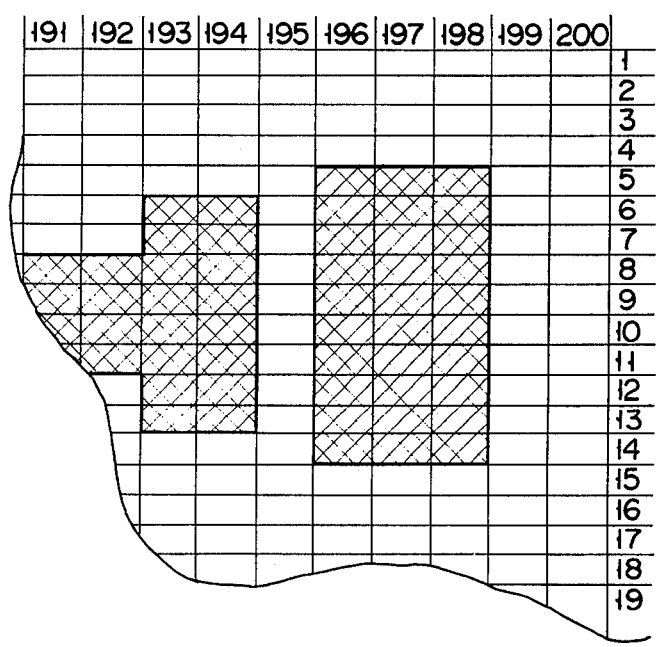
FIG. 5 shows areas to be exposed by the electron beam exposure apparatus according to the present invention in which the areas are designated by columns and rows.

The computer 46 includes a memory device (not shown) storing therein the information coded of the given pattern of the photoresist on the wafer to be exposed. More precisely, the memory device stores the information code of the patterns, for example, to be exposed defined by the given rows and columns, e.g. columns 191 to 200 and rows 1 to 19 as shown in FIG. 5. The contents of the memory device is fed to the blanking section control means 24.

Incidentally, although not shown in the figure, a position detector for detecting the position of the pattern is installed in the electron beam exposure apparatus. The pattern position detector detects the reference position of the pattern depicted on the wafer. Generally, in the manufacturing process of semiconductors, a plurality of patterns are subsequently formed; however, if the position of the pattern is improper, the semiconductor apparatus will not operate properly. It is for this reason that the reference position of the pattern formed on the wafer 12 must be detected. The results of the measurement by the pattern position detector are transferred to the computer 46 and then compared with the pattern to be exposed. On the basis of this comparison, the computer 46 issues the corresponding commands relating to the positioning to the stage moving control unit 70 and the positioning control unit 54.

The description to follow is the operation of the electron beam exposure apparatus thus constructed.

Figure 6:
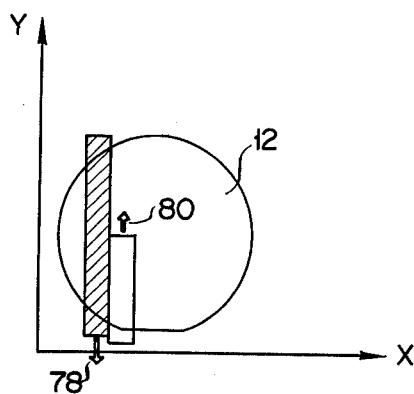
FIG. 6 schematically illustrates the exposure process onto the exposure patterns on the wafer which are bombarded by bundles of electron beams emitted by the electron beam exposure apparatus of the present invention.

Assume now that exposure will be made of a pattern on the wafer 12, as shown in FIG. 6. In this case, the wafer is about 8 cm in its diameter, and the region to be exposed is a square of 4 cm × 4 cm. A part of the pattern is illustrated in FIG. 5. In other words, the photoresist on the wafer is exposed with such the pattern. Further, 200 perforations 42 and 44 are formed to each plate 26 and 28, respectively. The blanking section 22 irradiates 200 bundles of parallel electron beams. More, the perforations 44 are squares of $2\mu \times 2\mu$, and the center-to-center distance of adjacent perforations is $100\mu$. The mask plate 28 is a rectangular plate of $10\mu$ in width and 21 mm in length. The reduction magnification of the lens means 8 is 1/10. $\pm 5\mu$ is the deflection distance on the wafer 12 of the bundles of electron beams by the X-deflection electrodes 62. A single bundle of electron beams scans an area of $10\mu \times 0.2\mu$ on the wafer 12.

When the wafer 12 is placed on the stage 66, the electron beam exposure apparatus starts to operate. When the pattern is already formed on the wafer 12, the pattern position detector (not shown) detects the reference position of the pattern. The detection result is fed to the computer 46, and then is compared with the pattern to be exposed. On the basis of the comparision result, the computer transfers the stage moving command to the stage moving control unit 70 and the positioning command to the positioning control unit 54. In response to the command, the stage moving control unit 70 moves the stage moving unit 68 to position or align the wafer 12 on the stage 66 at a predetermined position. The positioning control unit 54 controls the positioning coil 50 and the positioning collimeter 52 to slightly change the focal position of the first projection lense 48. The slight change of the focal position of the first projection lens 48 ensures a precise irradiation of the pattern onto the wafer 12.

After completion of the positioning of the wafer 12, the electron gun 2 emits electrons which in turn travel to the blanking section 22 through the condenser means 4. The electrons are divided into 200 bundles of electron beams in the blanking section 22. The blanking section 22 is controlled by the blanking section control unit 24, depending on the blanking command from the computer 46. The blanking section 22 controls the respective 200 sets of electrodes 30 mounted on sapphire plates 26 and 28 corresponding to the 200 perforations 42 and 44. For example, when the pattern to be exposed exists at the position defined by the column 194 and the row 6, no voltage is applied to the 194th electrodes 30. As a result, the electron beams advance straight forwardly, as shown in FIG. 3, and pass through the 194th perforation of the mask plate 28 to irradiate the photoresist on the wafer 12. When the pattern does not exist at the position of the 195th column and the 6th row, the voltage is applied to the 195th electrodes 30. Therefore, the bundles of electron beams are bent, as shown in FIG. 4, to hit the mask plate wall 28. The result is that no electron beam bundle is emitted from the 195th perforation and thus the photoresist on the corresponding position on the wafer 12 is not irradiated by electrons. The same controls are made simultaneously to the electrodes 1st to 200th, and thus the pattern corresponding to one line is exposed on the photoresist on the wafer 12.

As described above, each of the perforations 44 of the mask plate 28 has a size of $2\mu \times 2\mu$ so that the bundle of electron beams passed therethrough has a cross section of $2\mu \times 2\mu$. Further, the center-to-center distance of adjacent perforations 44 disposed linearly on the mask plate 28 is $100\mu$. Accordingly, the center-to-center distance of adjacent bundles of electron beams must be integral multiples of $100\mu$. These bundles of electron beams are totally reduced by 1/10th of the cross section of the electron beams bundle to expose the photoresist on the wafer 12. Each of the bundles of electron beams passed through the lens means 10 have the cross section of $0.2\mu \times 0.2\mu$ and the distance between adjacent bundles of electron beams is integral multiples of $10\mu$. Therefore, if the bundles of electron beams are irradiated onto the wafer 12 without any modification, the exposure onto the photoresist of the wafer 12 is made merely with a plurality of scattered square dots of $0.2\mu \times 0.2\mu$ whose center-to-center distance is spaced by integral multiples of $10\mu$. However, the deflection electrodes 62 deflect $\pm 5\mu$, i.e. $10\mu$, all the bundles of electron beams on the wafer 12, as previously mentioned, with the result that the rectangular region of $0.2\mu$ in width × $10\mu$ in length is exposed on the wafer and thus the 200 rectangular regions $0.2\mu \times 10\mu$ may all be exposed. Therefore, if the region defined by the column and row is $0.2\mu$ in width and $10\mu$ in length, one time irradiation of the electron beams enables the exposure to be made over the entire area of 200 regions, i.e. of $0.2\mu \times 2$ mm ($10\mu \times 200\mu$).

When the exposure of the pattern on the region designated by the 6th row is completed, none of the electron beam bundles are projected temporarily from the blanking section 22, as shown in FIG. 4, through the control of the blanking section controlling unit 24. Thus, in such a case, the bundles of electron beams are all deflected temporarily and none of the electron beams are emitted from the blanking section 22. Alternately, the bundles of electron beams may be discontinuously, i.e. intermittently, projected into the blanking section 22. For realizing such an intermittent projection, a shutter mechanism (not shown) may be provided in the electron beam irradiation direction of the electron gun, as an example.

Continuing now with the description of the operation of the electron beam exposure apparatus according to the present invention, when the bundles of electron beams are not irradiated onto the photoresist of the wafer 12, the stage moving unit moves and thus the wafer 12 placed thereon moves by 0.2μ in the Y-direction, i.e. in the counter direction indicated by arrow 78 (FIG. 6) so that the wafer 12 is positioned ready for exposure of the pattern onto the region designated by the 7th row (FIG. 6). Then, the exposure of the pattern is made onto the region of the photoresist of the wafer 12 defined by the 7th row, in the above-mentioned manner. The stage moving control unit 70 drives the stage moving unit 68, upon receipt of the command from the computer 46 when the first irradiation of the bundles of electron beams onto the photoresist of the wafer 12 is completed. The monitor 72 such as, for example, a laser interferometer, measures the movement of the wafer 12 moved by the stage moving unit 66 and transfers the measurement results to the computer 16. On the basis of the measurement results, the computer 46 issues a command to the stage moving control unit 70 which in turn controls the stage moving unit 68. In this way, the wafer 12 on the stage 66 is displaced properly in the Y-direction designated by arrow 78 in FIG. 6, for example, by 0.2μ.

After 200,000 of the above-mentioned exposures, the exposure over the area having the length of 4 cm (0.2μ × 200,000) is completed, as shaded in FIG. 6. When such exposure over the shaded area is completed, the movement command from the computer 46 drives the stage moving control means 70 which in turn moves the stage moving unit 68. Thus, the stage 66 moves by 2 mm in the X-direction. This movement of the stage 66 places the wafer 12 in position for another exposure over the area 0.2μ in width × 2 mm in length. With progression of the exposure over such an area by electron beams, the wafer 12 moves stepwise in the Y-direction designated by arrow 80 (FIG. 6) with an interval 0.2μ.

After 20 of the 4 cm × 2 mm area exposures, the exposure of the entire desired pattern onto the wafer 12 is complete. At this time, the electron beam exposure apparatus stops its operation.

Figure 7:
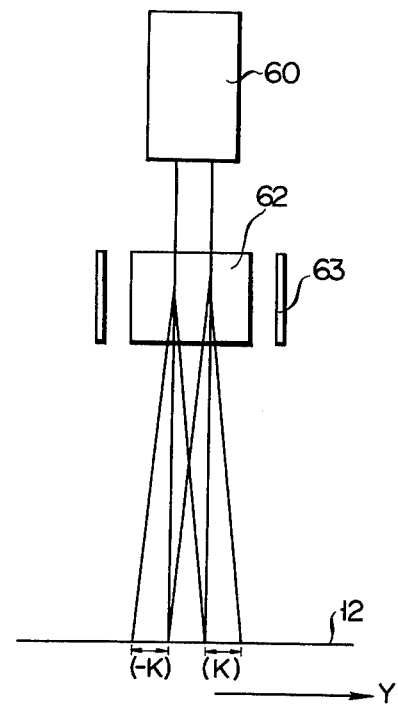
FIG. 7 schematically illustrates the operation of a light beam deflection device of the electron beam exposure apparatus of the present invention.
Figure 8:
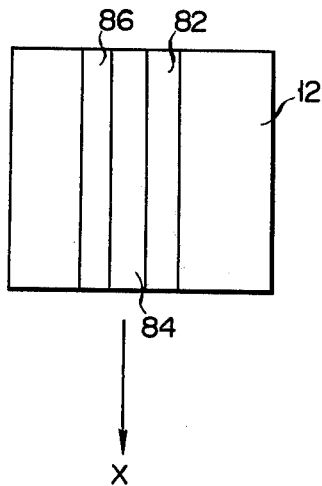
FIG. 8 illustrates the areas bombarded by bundles of electron beams deflected according to the scheme shown in FIG. 7.

In the thus far described example, the electron beam exposure apparatus does not use the Y-deflection electrodes 63. It is to be noted, however, that if the Y-deflection electrodes 63 are used, the irradiation area of the bundles of electron beams may be enlarged, thereby increasing the movement distance of the stage 66. For example, for ±0.2μ of the deflection range of the bundles of parallel electron beams by the Y-deflection electrodes 63, the area of 0.6μ × 2 mm is exposed before the stage 66 is moved. As shown in FIGS. 7 and 8, the bundles of parallel electron beams deflected by (K), or +0.2μ in the Y-direction, are deflected in the + X-direction so that the area 82 of 0.2μ × 2 mm is exposed. Then, the advancing bundles of electron beams without any deflection in the Y-direction are deflected in the -X direction so that the area 0.2μ × 2 mm indicated as 84 is exposed. Further, the bundles of parallel electron beams deflected by (−K), i.e. −0.2μ in the Y-direction, are deflected in the + X-direction to expose an area 0.2μ × 2 mm designated by reference numeral 86. As a result, the pattern 0.6μ × 2 mm is exposed without any movement of the stage 66. The similar exposure operation will be repeated after 0.6μ movement of the stage 66. Consequently, in the case of use of the Y-deflection electrodes 63, a large area may be exposed with a small number of stage movement times and thus the number of detection times of the movement distance of the wafer may be reduced.

Figure 9:
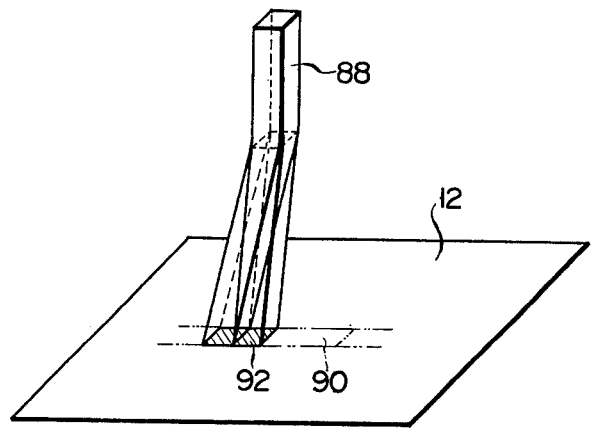
FIG. 9 schematically illustrates the operation of the pattern exposure as a modification of the pattern exposure according to the present invention.

It is to be noted that, in the above-mentioned embodiment, a single bundle of electron beams passed through the blanking section irradiates the area 0.2μ × 10μ; however, only 0.2μ × 0.2μ of the minimum area may be exposed. The single area 0.2μ × 10μ is designated by the row and column as shown in FIG. 5. However, when transmission of the bundles of electron beams therefor temporarily ceased in response to action of the blanking section 52, only the 0.2μ × 0.2μ area in the 0.2μ × 10μ area defined by the row and column may be irradiated. Let us consider this with a particular case of the single bundle of electron beams 88, referring to FIG. 9. It is assumed that the single bundle of electron beams 88 may irradiate the area 0.2μ × 10μ indicated as 90, on the wafer 12, through the operation of the X-deflection plate 62. As previously described, during the time period that the bundle of electron beams 88 passes between a pair of blanking electrodes 30, no electric field is developed therebetween. When a voltage is temporarily applied to the electrodes, the bundle of electron beams is shut off by the blanking section 22. Therefore, only the shadowed area 92, for example 0.2μ × 0.3μ, in the area 90 is exposed. Thus, if this fact is used, the exposure area on the wafer 12 may be exposed not only by defining it by the row and column but also by changing the voltage impression time to the blanking electrodes 30, although the exposure area in the later case is a part of that defined by the row and column. The exposure area in this case corresponds to the projection area of the bundle of electron beams 88, 0.2μ × 0.2μ, as the minimum one.

According to the electron beam exposure apparatus thus far mentioned of the present invention, the exposure time may be shortened by 1/200th as compared with that of the conventional exposure apparatus of the electron beam scanning type. The reason for this is that a number of electron beam bundles, for example, 200 bundles, formed by the blanking section irradiate simultaneously the wafer 12, while a single bundle of electron beams irradiates the wafer 12 in the conventional exposure apparatus. Further, the deflection of the bundles of electron beams is small compared with the conventional exposure apparatus so that compensation of the deflection of electron beams is not needed, ensuring a precise electron beam control.

Moreover, the pattern exposure may be made more precise compared with the conventional exposure apparatus of the electron beam projection type. In the conventional one, a pattern mask is used and a high precision is always required for the pattern mask. Therefore, if the pattern is complex, it is very difficult to prepare such a complex pattern mask. On the other hand, although the pattern precision in the case of the present invention depends to some degree on the precision of the perforations 44 of the mask plate 28 of the blanking section 22, these perforations 44 are rectilinearly arranged and the configuration of the perforation 44 is circular or square. For this, the perforations may be formed easily and precisely.

Moreover, the bundles of electron beams irradiated onto the photoresist of the wafer 12 are substantially parallel and their deflection angle is very small. Therefore, the depth of focus is deep. In other words, even if the photoresist on the wafer is uneven, the pattern is precisely formed on the wafer.

Additionally, since the desired pattern is stored in the memory device of the computer, any desired pattern may easily be obtained by changing the contents of the memory.

As seen from the foregoing description, according to the electron beam exposure apparatus of the present invention, any desired pattern may be exposed remarkably precisely and rapidly on the photoresist of the wafer. Therefore, the exposure apparatus of the present invention is suitable for mass production of semiconductor devices.

Various other modifications of the disclosed embodiment will become apparent to the person skilled in the art without departing from the spirit and scope of the present invention as defined by the appended claims.

What is claimed is:

1. An electron beam exposure apparatus comprising:
an electron gun for emitting electron beams;
condenser means for parallelling the electron beams emitted from said electron gun;
blanking means for dividing the parallel electron beams passed through said condenser means into a plurality of discrete electron beam bundles and for selectively intercepting any individual ones of said plurality of discrete electron beam bundles;
deflection means for deflecting in a predetermined direction all the discrete bundles of parallel electron beams passed through said blanking means; and
stage means for holding a wafer scanned by the discrete bundles of electron beams deflected by said deflection means and for moving the wafer by a predetermined distance.

2. An electron beam exposure apparatus according to claim 1, further comprising lens means for focusing the discrete bundles of electron beams passed through said blanking means to form compressed discrete bundles of parallel electron beams.

3. An electron beam exposure apparatus according to claim 2, in which said lens means comprises first lens means for focusing all the discrete bundles of parallel electron beams passed through said blanking means, positioning means disposed around the focal point of said first lens means for shifting the focal point slightly to move the irradiation area of said discrete plural bundles of electron beams, and second lens means for compressing and parallelling said discrete plural bundles of electron beams diverged after passing through the focal point of said first lens means and adjusted by said positioning means in comparison with the bundles of electron beams introduced to said first lens means.

4. An electron beam exposure apparatus according to claim 1, further comprising monitor means for continuously detecting the movement distance of the wafer moved by said stage means.

5. An electron beam exposure apparatus according to claim 1, in which said blanking means comprises a blanking section including a slit plate with a plurality of perforations equally spaced for dividing the parallel electron beams passed through said condenser means into the plurality of discrete electron beam bundles, deflection means for selectively deflecting any individual ones of said plurality of discrete bundles of electron beams passed through said perforations of said slit plate, and a mask plate with a plurality of perforations equally spaced, said mask plate disposed facing said slit plate and permitting only the discrete bundles of electron beams advancing straight from said perforations of said slit plate to pass therethrough.

6. An electron beam exposure apparatus according to claim 1, in which said deflection means comprises X-deflection electrodes for deflecting all the discrete bundles of electron beams in a beam bundles incoming plane.

7. An electron beam exposure apparatus according to claim 6, in which said deflection means further comprises Y-deflection electrodes for deflecting all the discrete bundles of electron beams in a direction substantially normal to the deflection direction of said X-deflection electrodes.

8. An electron beam exposure apparatus comprising:
an electron gun for emitting electron beams;
condenser means for parallelling the electron beams emitted from said electron gun;
blanking means including a blanking section for dividing the parallel electron beams passed through said condenser means into a plurality of discrete electron beam bundles and for selectively intercepting any individual ones of said plurality of discrete electron beam bundles and blanking section control means for controlling said blanking section for selectively intercepting any individual ones of said discrete electron beam bundles dependent on a pattern to be exposed;
deflection means for deflecting into an incoming beam bundles plane by a predetermined value all the discrete bundles of electron beams passed through said blanking means; and
stage means including a stage for holding a wafer scanned by the discrete bundles of electron beams deflected by said deflection means, stage moving means for moving said stage by a predetermined distance, and stage moving control means for driving said stage moving means after every one time the irradiation of said discrete bundles of electron beams on the wafer is completed.

9. An electron beam exposure apparatus according to claim 8, further comprising lens means for focusing the discrete bundles of electron beams passed through said blanking means to form compressed discrete bundles of parallel electron beams.

10. An electron beam exposure apparatus according to claim 9 in which said lens means comprises first lens means for focusing all the discrete bundles of electron beams passed through said blanking means, positioning means disposed around the focal point of said first lens means for shifting the focal point slightly to move the irradiation area of said discrete plural bundles of electron beams, and second lens means for compressing and parallelling said discrete bundles of electron beams diverged after passing through the focal point of said first lens means and adjusted by said positioning means in comparison with the bundles of electron beams introduced to said first lens means.

11. An electron beam exposure apparatus according to claim 8, further comprising monitor means for continously detecting the movement distance of the wafer moved by said stage means.

12. An electron beam exposure apparatus according to claim 8, in which said blanking section includes a slit plate with a plurality of perforations equally spaced for dividing the parallel electron beams passed through said condenser means into the plurality of discrete electron beam bundles, deflection means for selectively deflecting any individual ones of said plurality of discrete bundles of electron beams passed through said perforations of said slit plate, and a mask plate with a plurality of perforations equally spaced, said mask plate disposed facing said slit plate and permitting only the discrete bundles of electron beams advancing straight from said perforations of said slit plate to pass therethrough.

13. An electron beam exposure apparatus according to claim 8, in which said blanking section control means block progression of all the discrete bundles of electron beams by driving said blanking section every one time the irradiation of the discrete bundles of electron beams on the wafer is completed.

14. An electron beam exposure apparatus according to claim 8, in which said stage moving control means moves said stage by the exposure width of the wafer on said stage by driving said stage moving means every one time the irradiation of the bundles of electron beams is completed.

15. An electron beam exposure apparatus according to claim 8, in which said deflection means comprises X-deflection electrodes for deflecting all the bundles of electron beams in a beam bundles incoming plane.

16. An electron beam exposure apparatus according to claim 15, in which said deflection means further comprises Y-deflection electrodes for deflecting all the bundles of electron beams in a direction substantially normal to the deflection direction of said X-deflection electrodes.

* * * * *